(12) United States Patent
Morita

(10) Patent No.: US 12,176,314 B2
(45) Date of Patent: Dec. 24, 2024

(54) DICING DIE ATTACH FILM, AND SEMICONDUCTOR PACKAGE USING THE SAME AND METHOD OF PRODUCING SEMICONDUCTOR PACKAGE

(71) Applicant: FURUKAWA ELECTRIC CO., LTD., Tokyo (JP)

(72) Inventor: Minoru Morita, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 415 days.

(21) Appl. No.: 17/529,388

(22) Filed: Nov. 18, 2021

(65) Prior Publication Data

US 2022/0077101 A1  Mar. 10, 2022

Related U.S. Application Data

(63) Continuation of application No. PCT/JP2020/041623, filed on Nov. 6, 2020.

(30) Foreign Application Priority Data

Mar. 13, 2020 (JP) .................... 2020-044660

(51) Int. Cl.
*H01L 23/00* (2006.01)
*C09J 163/00* (2006.01)
*H01L 25/065* (2023.01)

(52) U.S. Cl.
CPC .......... *H01L 24/29* (2013.01); *C09J 163/00* (2013.01); *H01L 24/27* (2013.01); *H01L 24/32* (2013.01);
(Continued)

(58) Field of Classification Search
CPC ......... H01L 24/29; H01L 24/27; H01L 24/32; H01L 24/48; H01L 24/73; H01L 24/83; H01L 24/95; H01L 25/0657; H10B 80/00
(Continued)

(56) References Cited

U.S. PATENT DOCUMENTS

| | | | |
|---|---|---|---|
| 9,558,983 B2 * | 1/2017 | Taya | C09J 7/241 |
| 11,139,261 B2 * | 10/2021 | Morita | H01L 21/52 |
| 2021/0292617 A1 * | 9/2021 | Morita | H01L 23/49513 |

FOREIGN PATENT DOCUMENTS

| | | |
|---|---|---|
| CN | 102676105 A | 9/2012 |
| CN | 103460348 A | 12/2013 |

(Continued)

OTHER PUBLICATIONS

Chinese Office Action and Search Report for corresponding Chinese Application No. 202080005697.5, dated Nov. 23, 2022, with an English translation.

(Continued)

*Primary Examiner* — Jasmine J Clark
(74) *Attorney, Agent, or Firm* — Birch, Stewart, Kolasch & Birch, LLP

(57) ABSTRACT

A dicing die attach film, including an adhesive layer and a temporary-adhesive layer, the adhesive layer and the temporary-adhesive layer being laminated,
wherein
the adhesive layer is a film-like adhesive layer containing an epoxy resin (A), an epoxy resin curing agent (B), a phenoxy resin (C), and an inorganic filler (D);
an elastic modulus of the phenoxy resin (C) at 25° C. is 500 MPa or more; in the adhesive layer, a proportion of the phenoxy resin (C) in total content of the epoxy resin (A) and the phenoxy resin (C) is 10 to 60% by mass;
a peeling strength between the adhesive layer and the temporary-adhesive layer at a range of 25 to 80° C. is 0.40 N/25 mm or less; and (Continued)

a thermal conductivity of the adhesive layer after thermal curing is 1.0 W/m·K or more.

4 Claims, 2 Drawing Sheets

(52) U.S. Cl.
CPC .............. *H01L 24/48* (2013.01); *H01L 24/73* (2013.01); *H01L 24/83* (2013.01); *H01L 24/95* (2013.01); *H01L 25/0657* (2013.01); *C09J 2203/326* (2013.01); *C09J 2301/416* (2020.08); *H01L 2224/27002* (2013.01); *H01L 2224/27515* (2013.01); *H01L 2224/32145* (2013.01); *H01L 2224/32225* (2013.01); *H01L 2224/32245* (2013.01); *H01L 2224/48225* (2013.01); *H01L 2224/48245* (2013.01); *H01L 2224/73265* (2013.01); *H01L 2224/83002* (2013.01); *H01L 2224/83203* (2013.01); *H01L 2224/95001* (2013.01); *H01L 2225/0651* (2013.01); *H01L 2225/06524* (2013.01); *H01L 2225/06562* (2013.01); *H01L 2924/35121* (2013.01)

(58) Field of Classification Search
USPC ........................................................ 257/783
See application file for complete search history.

(56) References Cited

FOREIGN PATENT DOCUMENTS

| | | |
|---|---|---|
| CN | 107406742 A | 11/2017 |
| CN | 109496227 A | 3/2019 |
| JP | 2010-232422 A | 10/2010 |
| JP | 2012-207222 A | 10/2012 |
| JP | 2013-157589 A | 8/2013 |
| JP | 6366228 B2 | 8/2018 |
| TW | 201239056 A1 | 10/2012 |
| WO | WO 2016/035686 A1 | 3/2016 |
| WO | WO 2017/158994 A1 | 9/2017 |

OTHER PUBLICATIONS

International Search Report, issued in PCT/JP2020/041623, dated Dec. 8, 2020.

Japanese Notice of Reasons for Refusal, issued in Priority Application No. 2020-044660, dated Dec. 1, 2020.

Taiwanese Office Action, issued in corresponding Application No. 109139658, dated Sep. 30, 2021.

Philippine Office Action for corresponding Philippine Application No. 1/2021/552812, dated Mar. 6, 2023.

Taiwanese Office Action issued in corresponding Application No. 109139658, dated Mar. 29, 2022.

* cited by examiner

DICING DIE ATTACH FILM, AND SEMICONDUCTOR PACKAGE USING THE SAME AND METHOD OF PRODUCING SEMICONDUCTOR PACKAGE

CROSS-REFERENCE TO RELATED APPLICATIONS

This application is a Continuation of PCT International Application No. PCT/JP2020/041623 filed on Nov. 6, 2020, which claims priority under 35 U.S.C. § 119 (a) to Japanese Patent Application No. 2020-044660 filed in Japan on Mar. 13, 2020. Each of the above applications is hereby expressly incorporated by reference, in its entirely, into the present application.

TECHNICAL FIELD

The present invention relates to a dicing die attach film, and a semiconductor package using the same and a method of producing the semiconductor package.

BACKGROUND ART

With advanced downsizing, high-functionality, and multi-functionality of electronic devices in recent years, high-functionality and multi-functionality have also been advanced in semiconductor packages mounted in the electronic devices, and miniaturization in the wiring rule of the semiconductor wafer has been advanced. Stacked MCPs (Multi Chip Package) in which semiconductor chips are multistacked have been widely spread along with high-functionality and multi-functionality. Such stacked MCPs are mounted on memory packages for mobile phones, portable audio devices, and the like. Further, along with multi-functionality of mobile phones and the like, high densification and high integration of the package have also been advanced. Along with such advance, multistacking of the semiconductor chips has been further advanced.

Film-like adhesives (die attach films) have been used for bonding a wiring board and a semiconductor chip or bonding semiconductor chips (that is, die attach) in the production process of such a memory package. Along with multi-stacking of the chips, reduction in thickness of the die attach film has also been required. Also, miniaturization in the wiring rule of the wafer has been advanced in recent years, and, as a result, heat is more likely to be generated on the surface of the semiconductor element. In view of such circumstances, in order to facilitate releasing of heat to outside the package, these die attach films have been required to have high thermal conductivity.

As a thermally conductive die attach film, films formed by using a thermally conductive filler are generally designed.

As a material that can be used as the thermally conductive die attach film, for example, Patent Literature 1 describes an adhesive sheet used as a die bonding film, containing a spherical alumina filler having an average particle diameter of 2 to 9 μm and a specific surface area of 0.8 to 8.0 m²/g and a resin component containing a polymer component and a low molecular weight component at a specific weight ratio. According to the technique described in Patent Literature 1, use of this adhesive sheet increases a filling property into the unevenness of the adherend, thus enabling to suppress generation of voids.

In addition, Patent Literature 2 describes that, in a dicing die attach film in which a die attach layer, a temporary-adhesive layer, and a substrate layer are laminated in this order, controlling a peeling strength between the die attach layer and the temporary-adhesive layer at normal temperature and high temperature improves unstable picking up.

CITATION LIST

Patent Literatures

Patent Literature 1: Japanese Patent No. 6366228
Patent Literature 2: JP-A-2010-232422 ("JP-A" means an unexamined published Japanese patent application)

SUMMARY OF INVENTION

Technical Problem

The present inventor intended to improve the productivity of a semiconductor device for a dicing and pickup step of a semiconductor wafer using a dicing die attach film formed by laminating a thermally conductive adhesive layer (thermally conductive die attach film) and a temporary-adhesive layer (dicing film) and conducted research. As a result, the present inventor found that, after formation of chips by dicing the semiconductor wafer, when a process of peeling the chip from the dicing film by using a pickup collet in a state in which the thermally conductive die attach film is left on the back surface of the chip, and thermocompression bonding this chip to the wiring board is repeated, the pickup collet stores heat, and when the chip is picked up with such a pickup collet storing heat, heat transmitted to the dicing film via the die attach film having high thermal conductivity decreases the peeling property between the die attach film and the dicing film and thus tends to cause a pickup failure.

The present invention provides a dicing die attach film formed by laminating a thermally conductive die attach film and a dicing film, wherein, in a pickup step in semiconductor processing, a pickup failure is less likely to occur even when a pickup collet stores heat and generation of voids at the time of thermocompression bonding to a wiring board can be suppressed.

Solution to Problem

The present inventor conducted intensive research in view of the above problems, and as a result, found that inclusion of a phenoxy resin in a material constituting the die attach film improves the peeling property between the die attach film and the dicing film in the pickup step even in a case where the die attach film is a thermally conductive die attach film containing an inorganic filler. Further, the present inventor found that the above problems can be solved in a high level and a die attach property can also be further improved with a die attach film which employs, as the phenoxy resin, a phenoxy resin exhibiting an elastic modulus at normal temperature (25° C.) of a predetermined value or more and in which the thermal conductivity after thermal curing is controlled so as to be increased to a predetermined level or more by combining and blending an epoxy resin and a curing agent thereof at specific amounts.

The present invention has been realized by conducting intensive research based on this knowledge.

The above problems of the present invention are solved by the following means.

[1] A dicing die attach film, including:
an adhesive layer; and
a temporary-adhesive layer, wherein the adhesive layer and the temporary-adhesive layer are laminated, wherein the adhesive layer is a film-like adhesive layer containing an epoxy resin (A), an epoxy resin curing agent (B), a phenoxy resin (C), and an inorganic filler (D);
wherein an elastic modulus of the phenoxy resin (C) at 25° C. is 500 MPa or more;
wherein in the adhesive layer, a proportion of the phenoxy resin (C) in total content of the epoxy resin (A) and the phenoxy resin (C) is 10 to 60% by mass;
wherein a peeling strength between the adhesive layer and the temporary-adhesive layer at a range of 25 to 80° C. is 0.40 N/25 mm or less; and
wherein a thermal conductivity of the adhesive layer after thermal curing is 1.0 W/m·K or more.

[2]

The dicing die attach film according to [1], wherein when the adhesive layer is heated at a temperature elevation rate of 5° C./min from 25° C., an elastic modulus G' before curing in a range of 25 to 80° C. is 10 kPa or more.

[3]

The dicing die attach film according to [1] or [2], wherein when the adhesive layer is heated at a temperature elevation rate of 5° C./min from 25° C., a melt viscosity at 120° C. is in a range of 500 to 10,000 Pa·s.

[4]

The dicing die attach film according to any one of [1] to [3], wherein the temporary-adhesive layer is energy ray-curable.

[5]

A method of producing a semiconductor package, including the steps of:
  a first step of thermocompression bonding the dicing die attach film according to any one of [1] to [4] to a back surface of a semiconductor wafer in which at least one semiconductor circuit is formed on a surface so that the adhesive layer is in contact with the back surface of the semiconductor wafer;
  a second step of dicing the semiconductor wafer and the adhesive layer simultaneously to obtain a semiconductor chip with an adhesive layer, the semiconductor chip with an adhesive layer including the semiconductor chip and the adhesive layer on the temporary-adhesive layer;
  a third step of removing the temporary-adhesive layer from the adhesive layer and thermocompression bonding the semiconductor chip with an adhesive layer and a wiring board via the adhesive layer; and
  a fourth step of thermally curing the adhesive layer.

[6]

A semiconductor package wherein a semiconductor chip and a wiring board, or semiconductor chips are bonded with a thermally curable component of the adhesive layer of the dicing die attach film according to any one of [1] to [4].

The numerical ranges indicated with the use of the term "to" in the present invention refer to ranges including the numerical values before and after the term "to" respectively as the lower limit and the upper limit.

In the present invention, (meth)acryl means either or both of acryl and methacryl. The same applies to (meth)acrylate.

In the present invention, one type of each component may be used, or two or more types of these components may be mixed and used.

Advantageous Effects of Invention

The dicing die attach film of the present invention is formed by laminating a thermally conductive die attach film and a dicing film. The dicing die attach film of the present invention is less likely to cause a pickup failure in the pickup step of semiconductor processing even in a state where a pickup collet stores heat, and is excellent in a die attach property.

DESCRIPTION OF EMBODIMENTS

[Dicing Die Attach Film]

Figure 1:
FIG. 1 is a schematic longitudinal cross-sectional view illustrating a preferred embodiment of a first step of a method of producing a semiconductor package of the present invention.

In the dicing die attach film of the present invention, an adhesive layer (die attach film) and a temporary-adhesive layer (dicing film) are laminated. The dicing die attach film of the present invention can be in the form in which a temporary-adhesive layer and an adhesive layer are provided on a substrate (also referred to as a substrate film) in this order, and a release film may be provided on the adhesive layer. Also, it is also preferable that the dicing film and the die attach film have a specific shape as described in the production of the dicing die attach film.

The adhesive layer of the dicing die attach film of the present invention is a film-like adhesive layer containing an epoxy resin (A), an epoxy resin curing agent (B), a phenoxy resin (C), and an inorganic filler (D).

In the phenoxy resin (C) constituting this adhesive layer, the elastic modulus at normal temperature (25° C.) is 500 MPa or more, and the proportion of the phenoxy resin (C) in the total content of the epoxy resin (A) and the phenoxy resin (C) in the adhesive layer is 10 to 60% by mass.

Further, in the dicing die attach film of the present invention, the peeling strength (peeling strength before curing) between the adhesive layer and the temporary-adhesive layer is 0.40 N/25 mm or less in a range of 25 to 80° C. Also, the thermal conductivity after thermal curing of the adhesion layer is 1.0 W/m·K or more.

The form of each layer constituting the dicing die attach film of the present invention will be described in order.

<Adhesive Layer>

The adhesive layer constituting the dicing die attach film of the present invention contains at least an epoxy resin (A), an epoxy resin curing agent (B), a phenoxy resin (C), and an inorganic filler (D).

(Epoxy Resin (A))

The epoxy resin (A) can be used without any particularly limitation as long as it is a thermosetting resin having an epoxy group, and may be any of liquid, solid, and semi-solid. The liquid in the present invention means that the softening point is less than 25° C. The solid means that the softening point is 60° C. or more. The semi-solid means that the softening point is between the softening point of the liquid and the softening point of the solid (25° C. or more and less than 60° C.). As the epoxy resin (A) used in the present invention, the softening point is preferably 100° C. or less from the viewpoint of obtaining a film-like adhesive that can reach low melt viscosity in a preferable temperature range (for example, 60 to 120° C.). Incidentally, in the present invention, the softening point is a value measured by the softening point test (ring and ball) method (measurement condition: in accordance with JIS-2817).

In the epoxy resin (A) used in the present invention, the epoxy equivalent amount is preferably 500 g/eq or less, and more preferably 150 to 450 g/eq from the viewpoint of increasing the crosslinking density of a cured product, and as a result, increasing the contact ratio between blended inorganic fillers (D) and the contact area between inorganic fillers (D), thus providing higher thermal conductivity. Incidentally, in the present invention, the epoxy equivalent amount refers to the number of grams of resin containing one equivalent amount of epoxy group (g/eq).

The mass average molecular weight of the epoxy resin (A) is usually preferably less than 10,000, and more preferably 5,000 or less. The lower limit is not particularly limited, but is practically 300 or more.

The mass average molecular weight is a value obtained by GPC (Gel Permeation Chromatography) analysis.

Examples of the skeleton of the epoxy resin (A) include a phenol novolac type, an orthocresol novolac type, a cresol novolac type, a dicyclopentadiene type, a biphenyl type, a fluorene bisphenol type, a triazine type, a naphthol type, a naphthalene diol type, a triphenylmethane type, a tetraphenyl type, a bisphenol A type, a bisphenol F type, a bisphenol AD type, a bisphenol S type, a trimethylolmethane type, and the like. Among them, a triphenylmethane type, a bisphenol A type, a cresol novolac type, and an orthocresol novolac type are preferable from the viewpoint of being capable of obtaining a film-like adhesive having low resin crystallinity and good appearance.

The content of the epoxy resin (A) in the adhesive layer used in the present invention (in the solid content of a composition for forming the adhesive layer (total amount excluding a solvent)) is preferably 3 to 30% by mass, and more preferably 5 to 30% by mass. Setting the content to the above preferable lower limit or more can further improve the thermal conductivity of the film-like adhesive. On the other hand, setting the content to the above preferable upper limit or less can suppress generation of oligomer components and also prevent the state of the film (for example, film tack property) from changing even with a little temperature change.

(Epoxy Resin Curing Agent (B))

As the epoxy resin curing agent (B), optional curing agents such as amines, acid anhydrides, and polyhydric phenols can be used. In the present invention, a latent curing agent is preferably used from the viewpoint of allowing the adhesive layer containing the epoxy resin (A) and a phenoxy resin (C) described later to have low melt viscosity in a desired temperature range, and also allowing the adhesive layer to exhibit curability at a high temperature more than a certain temperature, have rapid curability and further have high storage stability that enables long term storage at room temperature.

Examples of the latent curing agent include a dicyandiamide compound, an imidazole compound, a curing catalyst-complex polyhydric phenol compound, a hydrazide compound, a boron trifluoride-amine complex, an aminimide compound, a polyamine salt, and modified products or microcapsules thereof. Use of an imidazole compound is more preferable from the viewpoint of providing even better latency (properties of being excellent in stability at room temperature and exhibiting curability by heating) and providing more rapid curing rate.

These may be used singly, or in combination of two or more types thereof.

The content of the epoxy resin curing agent (B) per 100 parts by mass of the epoxy resin (A) is preferably 0.5 to 100 parts by mass, and more preferably 1 to 80 parts by mass. Setting the content to the preferable lower limit or more can further reduce the curing time. On the other hand, setting the content to the preferable upper limit or less can suppress excessive remaining of the curing agent in the film-like adhesive. As a result, moisture absorption by the remaining curing agent can be suppressed, and thus the reliability of the semiconductor device can be improved.

(Phenoxy Resin (C))

In the phenoxy resin (C), the elastic modulus at normal temperature (25° C.) is 500 MPa or more. The elastic modulus at normal temperature (25° C.) of the phenoxy resin (C) is preferably 2,000 MPa or less. Use of the phenoxy resin having such an elastic modulus enables to achieve both a die attach property and a pickup property at a higher level.

The elastic modulus at normal temperature (25° C.) (also referred to as "elastic modulus at 25° C." in the present invention) can be determined by the method described in examples described later. Incidentally, the elastic modulus at normal temperature (25° C.) in a case where the adhesive layer contains two or more types of phenoxy resins can be determined by using, as a phenoxy resin film for measurement of elastic modulus at normal temperature in the method described in examples described later, a film produced by blending the phenoxy resin at a mixing ratio constituting the adhesive layer. For the elastic modulus at normal temperature (25° C.), the number including up to the ones place when the unit is MPa is effective.

The mass average molecular weight of the phenoxy resin (C) is usually 10,000 or more. The upper limit is not particularly limited, but is practically 5,000,000 or less. In particular, the mass average molecular weight is more preferably 10,000 to 100,000.

The mass average molecular weight of the phenoxy resin (C) is determined by GPC (Gel Permeation Chromatography) in terms of polystyrene.

The glass transition temperature (Tg) of the phenoxy resin (C) is preferably less than 120° C., more preferably less than 100° C., and even more preferably less than 90° C. The lower limit is preferably 0° C. or more, and more preferably 10° C. or more.

The glass transition temperature of the phenoxy resin (C) is a glass transition temperature measured by DSC (Differential Scanning calorimeter) at temperature elevation rate of 0.1° C./min.

The adhesive layer used in the present invention contains at least one type of phenoxy resin as the phenoxy resin (C).

Note that, in the present invention, for the epoxy resin (A) and the phenoxy resin (C), a resin having an epoxy equivalent amount (mass of resin per one equivalent amount of epoxy group) of 500 g/eq or less is classified into the epoxy resin (A), and a resin having an epoxy equivalent amount of more than 500 g/eq is classified into the phenoxy resin (C), respectively.

The phenoxy resin (C) can be obtained by a reaction of a bisphenol or biphenol compound with epihalohydrin such as epichlorohydrin, or a reaction of liquid epoxy resin with a bisphenol or biphenol compound.

In any of the reactions, the bisphenol or biphenol compound is preferably a compound represented by Formula (A).

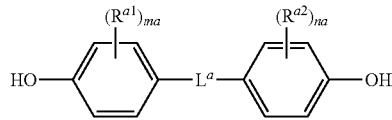

Formula (A)

In Formula (A), $L^a$ designates a single bond or divalent linking group, and $R^{a1}$ and $R^{a2}$ each independently designate a substituent. ma and na each independently designate an integer of 0 to 4.

In $L^a$, the divalent linking group is preferably an alkylene group, a phenylene group, —O—, —S—, —SO—, —SO$_2$—, or a group in which an alkylene group and a phenylene group are combined.

The number of carbon atoms of the alkylene group is preferably 1 to 10, more preferably 1 to 6, even more preferably 1 to 3, particularly preferably 1 or 2, and most preferably 1.

The alkylene group is preferably a group represented by —C($R^\alpha$)($R^\beta$)—. Here, $R^\alpha$ and $R^\beta$ each independently designate a hydrogen atom, an alkyl group, or an aryl group. $R^\alpha$ and $R^\beta$ may be bonded to each other to form a ring. $R^\alpha$ and $R^\beta$ are preferably a hydrogen atom or an alkyl group (for example, methyl, ethyl, isopropyl, n-propyl, n-butyl, isobutyl, hexyl, octyl, and 2-ethylhexyl). The alkylene group is, in particular, preferably —CH$_2$—, —CH(CH$_3$)—, or —C(CH$_3$)$_2$—, more preferably —CH$_2$— or —CH(CH$_3$)—, and even more preferably —CH$_2$—.

The number of carbon atoms of the phenylene group is preferably 6 to 12, more preferably 6 to 8, and even more preferably 6. Examples of the phenylene group include p-phenylene, m-phenylene, and o-phenylene, and p-phenylene or m-phenylene is preferable.

As the alkylene group and the phenylene group in the group in which an alkylene group and a phenylene group are combined, the above descriptions of the alkylene group and the phenylene group can be preferably applied.

The group in which an alkylene group and a phenylene group are combined is preferably an alkylene-phenylene-alkylene group, and more preferably —C(Ra)(RP)-phenylene-C($R^\alpha$)($R^\beta$)—.

The ring formed by bonding of $R^\alpha$ and $R^\beta$ is preferably a 5- or 6-membered ring, more preferably a cyclopentane ring or a cyclohexane ring, and even more preferably a cyclohexane ring.

$L^a$ is preferably a single bond, an alkylene group, —O—, or —SO$_2$—, and more preferably an alkylene group.

$R^{a1}$ and $R^{a2}$ are preferably an alkyl group, an aryl group, an alkoxy group, an alkylthio group, or a halogen atom, and more preferably an alkyl group, an aryl group, or a halogen atom, and even more preferably an alkyl group.

ma and na are preferably an integer of 0 to 2, more preferably 0 or 1, and even more preferably 0.

Examples of the bisphenol or biphenol compound include bisphenol A, bisphenol AD, bisphenol AP, bisphenol AF, bisphenol B, bisphenol BP, bisphenol C, bisphenol E, bisphenol F, bisphenol G, bisphenol M, bisphenol S, bisphenol P, bisphenol PH, bisphenol TMC, bisphenol Z, 4,4'-biphenol, 2,2'-dimethyl-4,4'-biphenol, 2,2',6,6'-tetramethyl-4,4'-biphenol, cardo skeleton type bisphenol, and the like. The bisphenol or biphenol compound is preferably selected from bisphenol A, bisphenol AD, bisphenol C, bisphenol E, bisphenol F, and 4,4'-biphenol, more preferably from bisphenol A, bisphenol E, and bisphenol F, and particularly preferably from bisphenol A.

The liquid epoxy resin is preferably diglycidyl ether of an aliphatic diol compound, and is more preferably a compound represented by Formula (B).

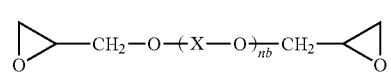

Formula (B)

In Formula (B), X designates an alkylene group, and nb designates an average repetition number of 1 to 10.

The number of carbon atoms of the alkylene group is preferably 2 to 10, more preferably 2 to 8, even more preferably 3 to 8, particularly preferably 4 to 6, and most preferably 6.

Examples of the alkylene group include ethylene, propylene, butylene, pentylene, hexylene, and octylene. Ethylene, trimethylene, tetramethylene, pentamethylene, heptamethylene, hexamethylene, or octamethylene is preferable.

nb is preferably 1 to 6, more preferably 1 to 3, and even more preferably 1.

Here, when nb is 2 to 10, X is preferably ethylene or propylene, and more preferably ethylene.

Examples of the aliphatic diol compound in diglycidyl ether include ethylene glycol, propylene glycol, diethylene glycol, triethylene glycol, polyethylene glycol, 1,3-propanediol, 1,4-butanediol, 1,5-heptanediol, 1,6-hexanediol, 1,7-pentanediol, and 1,8-octanediol.

In the above reaction, the phenoxy resin may be a phenoxy resin obtained by reacting a single bisphenol or biphenol compound, or aliphatic diol compound, or a phenoxy resin obtained by mixing and reacting two or more types of bisphenol or biphenol compound, or aliphatic diol compound. For example, a reaction of diglycidyl ether of 1,6-hexanediol with a mixture of bisphenol A and bisphenol F is exemplified.

The phenoxy resin (C) used in the present invention is preferably a phenoxy resin obtained by a reaction of a liquid epoxy resin with a bisphenol or biphenol compound, and more preferably a phenoxy resin having a repeating unit represented by Formula (I).

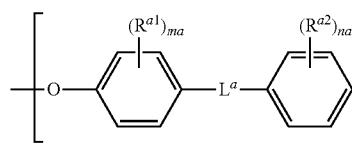 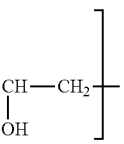

Formula (I)

In Formula (I), $L^a$, $R^{a1}$, $R^{a2}$, ma, and na have the same meanings as $L^a$, $R_{a1}$, $R^{a2}$ma, and na in Formula (A), and the preferable ranges are also the same. X and nb have the same meanings as those in Formula (B), and the preferable ranges are also the same.

In the present invention, a polymer of bisphenol A and diglycidyl ether of 1,6-hexanediol is preferable among these substances.

Further, the amount of epoxy group remaining in a small amount in the phenoxy resin (C) is preferably more than 5,000 g/eq in epoxy equivalent amount.

The phenoxy resin (C) may be synthesized by the above method, or a commercially available product may be used. Examples of the commercially available product include 1256 (bisphenol A type phenoxy resin, manufactured by Mitsubishi Chemical Corporation), YP-50 (bisphenol A type phenoxy resin, manufactured by NSCC Epoxy Manufacturing Co., Ltd.), YP-70 (bisphenol A/F type phenoxy resin, manufactured by NSCC Epoxy Manufacturing Co., Ltd.), FX-316 (bisphenol F type phenoxy resin, manufactured by NSCC Epoxy Manufacturing Co., Ltd.), FX-280S (cardo skeleton type phenoxy resin, manufactured by NSCC Epoxy Manufacturing Co., Ltd.), 4250 (bisphenol A type/F type phenoxy resin, manufactured by Mitsubishi Chemical Corporation), and the like. Also, low-elastic high-heat resistant phenoxy resins such as FX-310 (low elastic-high heat resistant phenoxy resin, manufactured by NSCC Epoxy Manufacturing Co., Ltd.) can also be preferably used.

In the adhesive layer, the proportion of the phenoxy resin (C) in the total content of the epoxy resin (A) and the phenoxy resin (C) is 10 to 60% by mass, preferably 15 to 50% by mass, and more preferably 18 to 45% by mass.

(Inorganic Filler (D))

The inorganic filler (D) is not particularly limited as long as it is an inorganic filler having thermal conductivity. The inorganic filler (D) imparts thermal conductivity to the adhesive layer.

The inorganic filler (D) is a particle made of a thermally conductive material or a particle whose surface is coated with a thermally conductive material. The thermal conductivity of the thermally conductive material is preferably 12 W/m·K or more, and more preferably 30 W/m·K or more.

When the thermal conductivity of the thermally conductive material is the preferable lower limit or more, the amount of the inorganic filler (D) blended in order to obtain a desired thermal conductivity can be reduced. This suppresses increase in the melt viscosity of the adhesive layer and enables to further improve the filling property of the film into the unevenness of the substrate at the time of compression bonding to the substrate. As a result, generation of voids can be more reliably suppressed.

In the present invention, the thermal conductivity of the thermally conductive material means the thermal conductivity at 25° C., and the literature value for each material can be used. In a case where there is no description in the literates, for example, the value measured in accordance with JIS R 1611 can be used in the case of ceramics, or the value measured in accordance with JIS H 7801 can be used in the case of metals in substitution for the literature value.

Examples of the inorganic filler (D) include thermally conductive ceramics, and preferred examples thereof include alumina particles (thermal conductivity: 36 W/m·K), aluminum nitride particles (thermal conductivity: 150 to 290 W/m·K), boron nitride particles (thermal conductivity: 60 W/m·K), zinc oxide particles (thermal conductivity: 54 W/m·K), a silicon nitride filler (thermal conductivity: 27 W/m·K), silicon carbide particles (thermal conductivity: 200 W/m·K), and magnesium oxide particles (thermal conductivity: 59 W/m·K).

In particular, alumina particles having high thermal conductivity are preferable in terms of dispersibility and availability. Further, aluminum nitride particles and boron nitride particles are preferable from the viewpoint of having even higher thermal conductivity than that of alumina particles. In the present invention, alumina particles and aluminum nitride particles are preferable among these particles.

Further, the inorganic filler (D) include particles whose surfaces are coated with a metal having thermal conductivity. Preferred examples of such particles include silicone resin particles and acrylic resin particles whose surfaces are coated with metals such as silver (thermal conductivity: 429 W/m·K), nickel (thermal conductivity: 91 W/m·K), gold (thermal conductivity: 329 W/m·K), and the like.

In particular, silicone resin particles whose surfaces are coated with silver are preferable from the viewpoint of a stress relaxing property and high heat resistance.

The inorganic filler (D) may be subjected to surface treatment or surface modification. Examples of a compound used for such a surface treatment and surface modification include a silane coupling agent, phosphoric acid or a phosphoric acid compound, or a surfactant, and the like. In addition to the items described in the present specification, for example, the descriptions of the silane coupling agent, the phosphoric acid or phosphoric acid compound, and the surfactant in the section of the thermally conductive filler in WO 2018/203527 or the section of the aluminum nitride filler in WO 2017/158994 can be applied.

A method of blending the inorganic filler (D) to resin components such as the epoxy resin (A), the epoxy resin curing agent (B), and the phenoxy resin (C) includes a method in which a powder inorganic filler and, as necessary, a silane coupling agent, phosphoric acid or a phosphoric acid compound, and a surfactant are directly blended (integral blending method), or a method in which a slurry inorganic filler obtained by dispersing an inorganic filler treated with a surface treatment agent such as a silane coupling agent, phosphoric acid or a phosphoric acid compound, and a surfactant in an organic solvent is blended.

A method of subjecting the inorganic filler (D) to treatment with the silane coupling agent is not particularly limited. Examples thereof include a wet method of mixing the inorganic filler (D) and the silane coupling agent in a solvent, a dry method of subjecting the inorganic filler (D)

and the silane coupling agent to treatment in the gas phase, the above integral blending method, and the like.

In particular, the aluminum nitride particles contribute to high thermal conductivity, but tend to generate ammonium ions due to hydrolysis. It is therefore preferable that the aluminum nitride particles are used in combination with a phenol resin having a low moisture absorption rate and hydrolysis is suppressed by surface modification. As a surface modification method of the aluminum nitride particles, a method of providing a surface layer with an oxide layer of aluminum oxide to improve water resistance and then preforming surface treatment with phosphoric acid or a phosphoric acid compound to improve affinity with the resin is particularly preferable.

It is also preferable to subject the surface of the inorganic filler (D) to treatment with a silane coupling agent.

In addition, it is also preferable to additionally use an ion trapping agent in combination.

The silane coupling agent is a compound in which at least one hydrolyzable group such as an alkoxy group and an aryloxy group is bonded to a silicon atom. In addition to these groups, an alkyl group, an alkenyl group, and an aryl group may be bonded to the silicon atom. The alkyl group is preferably an alkyl group substituted with an amino group, an alkoxy group, an epoxy group, or a (meth)acryloyloxy group, and more preferably an alkyl group substituted with an amino group (preferably, a phenylamino group), an alkoxy group (preferably, a glycidyloxy group), or a (meth) acryloyloxy group.

Examples of the silane coupling agent include 2-(3,4-epoxycyclohexyl)ethyltrimethoxysilane, 3-glycidyloxypropyltrimethoxysilane, 3-glycidyloxypropyltriethoxysilane, 3-glycidyloxypropylmethyldimethoxysilane, 3-glycidyloxypropyl methyldiethoxysilane, dimethyldimethoxysilane, dimethyldiethoxysilane, methyltrimethoxysilane, methyltriethoxysilane, phenyltrimethoxysilane, phenyltriethoxysilane, N-phenyl-3-aminopropyltrimethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane, and the like.

The silane coupling agent or the surfactant is preferably contained in an amount of 0.1 to 2.0 parts by mass per 100 parts by mass of the inorganic filler (D).

Setting the content of the silane coupling agent or the surfactant to the preferable range can suppress peeling at the adhesion interface caused by volatilization of an excessive silane coupling agent and surfactant in the heating process in semiconductor assembling (for example, a reflow process) while aggregation of the inorganic filler (D) is suppressed. As a result, generation of voids can be suppressed and adhesiveness can be improved.

Examples of the shape of the inorganic filler (D) include a flake shape, a needle shape, a filament shape, a spherical shape, and a scale shape, but a spherical particle is preferable from the viewpoint of achieving higher filling and fluidity.

In addition, the average particle diameter (d50) of the inorganic filler (D) is preferably 0.1 to 3.5 μm. The average particle diameter (d50) is a so-called median diameter, and refers to a particle diameter at which the cumulative volume is 50% when the particle size distribution is measured by the laser diffraction scattering method and the total volume of the particles is defined as 100% in the cumulative distribution.

In the adhesive layer used in the present invention, the proportion of the inorganic filler (D) in the total content of the epoxy resin (A), the epoxy resin curing agent (B), the phenoxy resin (C), and the inorganic filler (D) is 30 to 70% by volume. The content proportion of the inorganic filler (D) being the lower limit or more can impart a desired thermal conductivity and melt viscosity to the film-like adhesive, and thus can provide a heat dissipation effect from the semiconductor package and suppress protrusion failure of the film-like adhesive. Also, the content proportion of the inorganic filler (D) being the upper limit or less can impart a desired melt viscosity to the film-like adhesive, and thus can suppress generation of voids. Further, such a content proportion allows relaxing of internal stress generated in the semiconductor package during thermal change, and also allows improvement of an adhesive force.

The proportion of the inorganic filler (D) in the total content of the components (A) to (D) is preferably 20 to 60% by volume, and more preferably 20 to 50% by volume.

The content of the inorganic filler (D) (% by volume) can be calculated from the content mass and the specific gravity of each of the components (A) to (D).

(Other Components)

The adhesive layer used in the present invention may contain a polymer compound in addition to the epoxy resin (A), the epoxy resin curing agent (B), the phenoxy resin (C), and the inorganic filler (D) as long as the effects of the present invention are not impaired.

Examples of the polymer compound include natural rubber, butyl rubber, isoprene rubber, chloroprene rubber, silicone rubber, an ethylene-vinyl acetate copolymer, an ethylene-(meth)acrylic acid copolymer, an ethylene-(meth) acrylic acid ester copolymer, polybutadiene resin, polycarbonate resin, thermoplastic polyimide resin, polyamide resins such as 6-nylon and 6,6-nylon, (meth)acrylic resin, polyester resins such as polyethylene terephthalate and polybutylene terephthalate, polyamideimide resin, fluororesin, and the like. These polymer compounds may be used singly, or in combination of two or more types thereof.

Further, the adhesive layer used in the present invention may further contain an ion trapping agent (ion capturing agent), a curing catalyst, a viscosity adjusting agent, an antioxidant, a flame retardant, a coloring agent, and the like. The adhesive layer used in the present invention may contain, for example, other additives described in WO 2017/158994.

The proportion of the total content of the epoxy resin (A), the epoxy resin curing agent (B), the phenoxy resin (C), and the inorganic filler (D) in the adhesive layer used in the present invention can be, for example, 60% by mass or more, preferably 70% by mass or more, even more preferably 80% by mass or more, and may also be 90% by mass or more. Also, the proportion may be 100% by mass, and can be 95% by mass or less.

(Characteristics of Adhesive Layer)

—Thermal Conductivity after Thermal Curing—

In the adhesive layer used in the present invention, the thermal conductivity after thermal curing is 1.0 W/m·K or more. The thermal conductivity is preferably 1.4 Winn·K or more. When the thermal conductivity is less than the lower limit, there is a tendency that generated heat is less likely to be released to outside of the package. The thermally conductive film-like adhesive of the present invention exhibits such excellent thermal conductivity after thermal curing. Thus, a semiconductor package having improved heat dissipation efficiency to outside of the semiconductor package can be obtained by firmly bonding the thermally conductive film-like adhesive of the present invention to an adherend such as a semiconductor wafer and a wiring board, followed by thermally curing.

The upper limit of the thermal conductivity is not particularly limited, but is usually 30 W/m·K or less.

Here, the expression "after thermal curing in the measurement of thermal conductivity" refers to a state in which curing of the adhesive layer has been completed. Specifically, it is a state in which no heat reaction peak is observed when DSC (Differential Scanning calorimeter) measurement is performed at a temperature elevation rate of 10° C./min.

In the present invention, such a thermal conductivity of the adhesive layer after thermal curing refers to a value obtained by measuring the thermal conductivity by using a thermal conductivity measurement apparatus (trade name: HC-110, manufacture by Eko Instruments Co., Ltd) according to the heat flow meter method (in accordance with JIS-A1412). Specifically, the measurement method described in examples can be used as a reference. For the thermal conductivity, the number including down to the first decimal place when the unit is W/m·K is effective.

The thermal conductivity can be adjusted to the above range by the content of the inorganic filler (D), further, the type of the inorganic filler (D), and the type or content of the compound or resin in which the epoxy resin (A), the epoxy resin curing agent (B), the phenoxy resin (C), and the like coexist. The same applies to the following elastic modulus before curing and the melt viscosity.

—Elastic Modulus Before Curing—

In the adhesive layer used in the present invention, the elastic modulus G' before curing in a range of 25 to 80° C. when the adhesive layer before thermal curing is heated at a temperature elevation rate of 5° C./min from 25° C. is preferably 10 kPa or more, from the viewpoint of increasing a pickup property. In addition, in the above measurement condition, the elastic modulus before curing at 25° C. is preferably 400 kPa or more, more preferably 450 kPa or more, even more preferably 500 kPa or more, and also preferably 600 kPa or more. Also, in the above measurement condition, the elastic modulus before curing at 80° C. is preferably 12 kPa or more, more preferably 15 kPa or more, and even more preferably 20 kPa or more.

The elastic modulus G' before curing can be determined by the method described in examples described later. For the elastic modulus before curing G', the number including up to the ones place when the unit is kPa is effective.

In the present invention, the adhesive layer before thermal curing refers to an adhesive layer which is not exposed to a temperature condition of 25° C. or more after formation of the adhesive layer. The dicing die attach film of the present invention is usually stored under the temperature condition of 10° C. or less. Therefore, the adhesive layer before thermal curing usually refers to an adhesive layer which is stored at a temperature of 10° C. or less after formation of the adhesive layer.

(Melt Viscosity)

In the adhesive layer used in the present invention, the melt viscosity at 120° C. when the adhesive layer before thermal curing is heated at a temperature elevation rate of 5° C./min from 25° C. is preferably in a range of 500 to 10,000 Pa·s, more preferably in a range of 1,000 to 10,000 Pas, and even more preferably in a range of 1,500 to 9,200 Pas, from the viewpoint of increasing a die attach property.

The melt viscosity can be determined by the method described in examples described later. For the melt viscosity, the number including up to the tens place when the unit is Pas is effective.

(Formation of Adhesive Layer)

The adhesive layer used in the present invention can be formed by preparing a composition for forming an adhesive layer (varnish) containing constituents of the adhesive layer, applying this composition onto a release-treated release film, followed by drying. The composition for forming an adhesive layer usually contains a solvent.

The thickness of the adhesive layer is preferably 200 µm or less, more preferably 100 µm or less, even more preferably 50 µm or less, also preferably 30 µm or less, and also preferably 20 µm or less. The thickness of the adhesive layer is usually 1 µm or more, also preferably 2 µm or more, and may be 4 µm or more.

The thickness of the film-like adhesive can be measured by a contact type linear gauge method (desk-top contact type thickness measurement apparatus).

As the release-treated release film, any release film that functions as a cover film for the obtained film-like adhesive can be used, and a publicly known release film can be appropriately employed. Examples thereof include release-treated polypropylene (PP), release-treated polyethylene (PE), and release-treated polyethylene terephthalate (PET). A publicly known method can be appropriately employed as the application method, and examples thereof include methods using a roll knife coater, a gravure coater, a die coater, a reverse coater, and the like.

In the adhesive layer, the arithmetic average roughness Ra of a surface to be bonded to the wafer is preferably 3.0 µm or less, and the arithmetic average roughness Ra of a surface on any side to be bonded to the adherend is more preferably 3.0 µm or less.

The arithmetic average roughness Ra is more preferably 2.0 µm or less, and even more preferably 1.5 µm or less. The lower limit is not particularly limited, but is practically 0.1 µm or more.

<Temporary-Adhesive Layer>

A general configuration and method used as a dicing film (dicing tape) can be appropriately applied to the temporary-adhesive layer constituting the dicing die attach film of the present invention and the method of forming the temporary-adhesive layer. As the temporary-adhesive constituting the temporary-adhesive layer, general temporary-adhesives used for application of the temporary-adhesive film, for example, an acrylic temporary-adhesive, a rubber temporary-adhesive, and the like can be appropriately used. Among them, the temporary-adhesive layer is preferably energy ray-curable.

As the acrylic temporary-adhesive, for example, a resin composed of (meth)acrylic acid and an ester thereof, a copolymer of (meth)acrylic acid and an ester thereof with an unsaturated monomer copolymerizable with these substances (for example, vinyl acetate, styrene, acrylonitrile, and the like) are used. Further, two or more types of these resins may be mixed and used. Among them, a copolymer containing, as a constituent, at least one type selected from methyl (meth)acrylate, ethylhexyl (meth)acrylate, and butyl (meth)acrylate and at least one type selected from hydroxyethyl (meth)acrylate and vinyl acetate. This facilitates control of adhesion or adhesiveness to the adherend.

In order to make the temporary-adhesive layer used in the present invention energy ray-curable, it is possible to introduce a polymerizable group (for example, a carbon-carbon unsaturated bond) into a polymer constituting the temporary-adhesive layer or blend a polymerizable monomer in the temporary-adhesive layer. This polymerizable monomer preferably has two or more polymerizable groups (preferably, three or more). That is, the term "energy ray-curable" refers to having characteristics of being cured by irradiation with an energy ray.

Examples of the energy ray include an ultraviolet ray, an electron beam, and the like.

As the temporary-adhesive layer used in the present invention, for example, the descriptions of JP-A-2010-232422, Japanese Patent No. 2661950, JP-A-2002-226796, JP-A-2005-303275, and the like can be used as a reference.

The thickness of the temporary-adhesive layer is preferably 1 to 200 μm, more preferably 2 to 100 μm, even more preferably 3 to 50 μm, and also preferably 5 to 30 μm.

In the dicing die attach film of the present invention, the peeling strength between the adhesive layer and the temporary-adhesive layer in a range of 25 to 80° C. is 0.40 N/25 mm or less. This peeling strength is the peeling strength between the adhesive layer and the temporary-adhesive layer after irradiation with an energy ray in a case where the temporary-adhesive layer is energy ray-curable. The peeling strength between the adhesive layer and the temporary-adhesive layer at 25° C. is preferably 0.30 N/25 mm or less, and more preferably 0.20 N/25 mm or less. Further, the peeling strength between the adhesive layer and the temporary-adhesive layer at 80° C. is preferably 0.35 N/25 mm or less.

The peeling strength can be determined by the method described in examples. For the peeling strength, the number including down to the second decimal place when the unit is N/25 mm is effective.

<Production of Dicing Die Attach Film>

The method of producing the dicing die attach film of the present invention is not particularly limited as long as the dicing die attach film has a structure in which the adhesive layer and the temporary-adhesive layer are laminated.

For example, a coating liquid containing a temporary-adhesive is applied onto a release-treated release liner and dried to form a temporary-adhesive layer, and then the temporary-adhesive layer and a substrate film are bonded. Thus, a film (dicing film) in which the substrate film, the temporary-adhesive layer, and the release liner are laminated in this order is produced. Separately from the above film, a composition for forming an adhesive layer is applied onto a release film and dried to form an adhesive layer on the release film, thus producing a die attach film. Then, the dicing film and the die attach film are bonded in a manner that the temporary-adhesive layer exposed by peeling off the release liner and the adhesive layer are in contact. Thus, a dicing die attach film in which the substrate film, the temporary-adhesive layer, the adhesive layer, and the release film are laminated in this order can be obtained.

Bonding of the dicing film and the die attach film is preferably performed under a pressurized condition.

In the bonding of the dicing film and the die attach film, the shape of the dicing film is not particularly limited as long as the opening of the ring frame can be covered, but is preferably a circular shape. The shape of the die attach film is not particularly limited as long as the back surface of the wafer can be covered, but is preferably a circular shape. The dicing film is larger than the die attach film, and preferably has a shape having a portion in which the temporary-adhesive layer is exposed around the adhesive layer. As such, it is preferable to bond a dicing film and a die attach film which are cut into a desired shape.

The dicing die attach film produced as described above is used by peeling the release film at the time of use.

[Semiconductor Package and Method of Producing Semiconductor Package]

Then, preferred embodiments of a semiconductor package and a method of producing the semiconductor package of the present invention will be described in detail with reference to the drawings. Note that, in the descriptions and drawings below, the same reference numerals are given to the same or corresponding components, and overlapping descriptions will be omitted. FIGS. 1 to 7 are schematic longitudinal cross-sectional views each illustrating a preferred embodiment of each step of a method of producing a semiconductor package of the present invention.

In the method of producing a semiconductor package of the present invention, as a first step, as illustrated in FIG. 1, firstly, the dicing die attach film of the present invention is thermocompression bonded to the back surface of a semiconductor wafer 1 in which at least one semiconductor circuit is formed on the surface (that is, a surface of the semiconductor wafer 1 on which the semiconductor circuit is not formed) on a side of the adhesive layer (that is, thermocompression bonded so as to be in contact with the adhesive layer and the back surface of the semiconductor wafer). Thus, an adhesive layer 2 and a temporary-adhesive layer 3 are provided on the semiconductor wafer 1 in this order. In FIG. 1, the adhesive layer 2 is illustrated smaller than the temporary-adhesive layer 3, but the sizes (areas) of both layers are appropriately set according to the purpose. For the condition of thermocompression bonding, thermocompression bonding is performed at a temperature at which the epoxy resin (A) is not thermally cured actually. For example, the condition of a temperature of 70° C. and a pressure of 0.3 MPa is exemplified.

As the semiconductor wafer 1, a semiconductor wafer in which at least one semiconductor circuit is formed on the surface can be appropriately used. Examples of such a wafer include a silicon wafer, a SiC wafer, a GaAs wafer, and a GaN wafer. In order to provide the dicing die attach film of the present invention on the back surface of the semiconductor wafer 1, for example, a publicly known apparatus such as a roll laminator and a manual laminator can be appropriately used.

Figure 2:
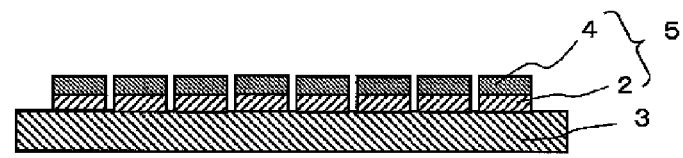
FIG. 2 is a schematic longitudinal cross-sectional view illustrating a preferred embodiment of a second step of a method of producing a semiconductor package of the present invention.

Then, as a second step, the semiconductor wafer 1 and the adhesive layer 2 are simultaneously diced as illustrated in FIG. 2. Thus, a semiconductor chip 5 with an adhesive layer, including a semiconductor chip 4 and the adhesive layer 2 on the temporary-adhesive layer 3 is obtained. The dicing tape (not illustrated) is not particularly limited, and a publicly known dicing tape can be appropriately used. Further, an apparatus used for dicing (not illustrated) is not particularly limited, and a publicly known dicing apparatus can be appropriately used.

Figure 3:
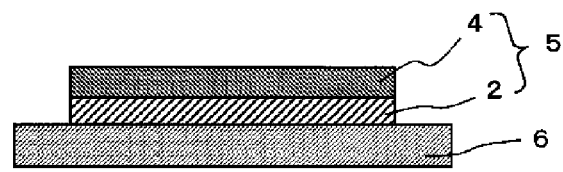
FIG. 3 is a schematic longitudinal cross-sectional view illustrating a preferred embodiment of a third step of a method of producing a semiconductor package of the present invention.

Then, as a third step, the temporary-adhesive layer is cured with energy rays as necessary to reduce the adhesion force, and then the temporary-adhesive layer 3 is removed from the adhesive layer 2 by picking up and the like. Thereafter, as illustrated in FIG. 3, the semiconductor chip 5 with an adhesive layer and the wiring board 6 are thermocompression bonded via the adhesive layer 2 to mount the semiconductor chip 5 with an adhesive layer on the wiring board 6. As the wiring board 6, a substrate in which a semiconductor circuit is formed on the surface can be appropriately used. Examples of such a substrate include a print circuit board (PCB), various lead frames, and a substrate in which electronic components such as a resistive element and a capacitor are mounted on the surface of the substrate.

A method of mounting the semiconductor chip 5 with an adhesive layer on such a wiring board 6 is not particularly limited. A conventional method that enables to bond the semiconductor chip 5 with an adhesive layer to the wiring board 6 or the electronic component mounted on the surface of the wiring board 6 by utilizing the adhesive layer 2 can be appropriately employed.

Then, as a fourth step, the adhesive layer 2 is thermally cured. The temperature for thermal curing is not particularly limited as long as it is a temperature equal to or more than the thermal curing start temperature of the adhesive layer 2. The temperature varies depending on the type of the epoxy resin (A), the phenoxy resin (C), and the epoxy curing agent (B) to be used. The temperature is, although it cannot be said unconditionally, for example, preferably 100 to 180° C., and more preferably 140 to 180° C. from the viewpoint that curing at higher temperature takes short time and allows curing. When the temperature is less than the thermal curing start temperature, thermal curing does not proceed, and as a result, the strength of the adhesive layer 2 tends to decrease. On the other hand, when the temperature is more than the above upper limit, the epoxy resin, the curing agent, the additives, and the like in the adhesive layer 2 volatilize during the curing process and thus tend to foam. Also, the time for curing treatment is preferably, for example, 10 to 120 minutes.

Figure 4:
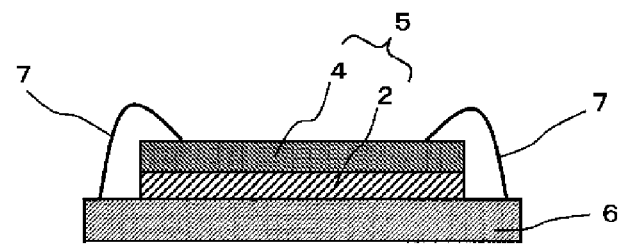
FIG. 4 is a schematic longitudinal cross-sectional view illustrating a preferred embodiment of a step of connecting a bonding wire of a method of producing a semiconductor package of the present invention.

Next, in the method of producing a semiconductor package of the present invention, it is preferable that the wiring board 6 and the semiconductor chip 5 with an adhesive layer are connected via a bonding wire 7 as illustrated in FIG. 4. Such a connection method is not particularly limited, and a publicly known method, for example, a wire bonding method, a TAB (Tape Automated Bonding) method, and the like can be appropriately employed.

Figure 5:
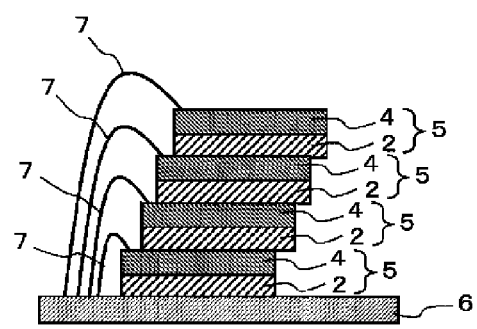
FIG. 5 is a schematic longitudinal cross-sectional view illustrating an example of an embodiment of multistacking of a method of producing a semiconductor package of the present invention.
Figure 6:
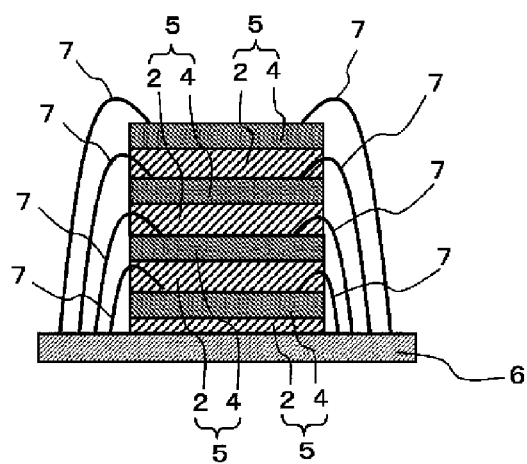
FIG. 6 is a schematic longitudinal cross-sectional view illustrating an example of an embodiment of another multistacking of a method of producing a semiconductor package of the present invention.

Further, a plurality of semiconductor chips 4 can be stacked by thermocompression bonding another semiconductor chip 4 to the surface of the mounted semiconductor chip 4, performing thermal curing, and then connecting the semiconductor chips 4 again to the wiring board 6 by wire bonding. For example, the stacking method include a method of stacking the semiconductor chips in slightly different positions as illustrated in FIG. 5, or a method of stacking the semiconductor chips by increasing the thicknesses of the adhesive layers 2 of the second layer or later and thereby embedding the bonding wire 7 in the adhesive layer 2 as illustrated in FIG. 6, and the like.

Figure 7:
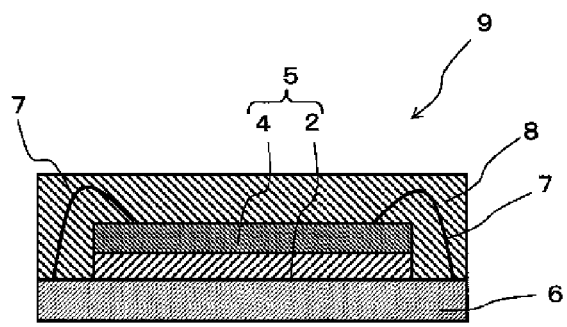
FIG. 7 is a schematic longitudinal cross-sectional view illustrating a preferred embodiment of a semiconductor package produced by a method of producing a semiconductor package of the present invention.

In the method of producing a semiconductor package of the present invention, it is preferable to seal the wiring board 6 and the semiconductor chip 5 with an adhesive layer with a sealing resin 8 as illustrated in FIG. 7. In this way, a semiconductor package 9 can be obtained. The sealing resin 8 is not particularly limited, and a publicly known sealing resin that can be used for the production of the semiconductor package can be appropriately used. In addition, a sealing method with the sealing resin 8 is not particularly limited, and a publicly known method can be appropriately employed.

The semiconductor package of the present invention is formed by bonding the semiconductor chip and the wiring board, or the semiconductor chips with a thermally curable component of the adhesive layer of the dicing die attach film of the present invention.

As illustrated in FIGS. 4 and 7, one example of the semiconductor package of the present invention includes a semiconductor package 9 having a structure in which the semiconductor chip 4 and the wiring board 6 are bonded via the thermally curable component of the adhesive layer of the dicing die attach film of the present invention (in FIG. 7, a semiconductor package 9 in the form in which the structure is sealed). Also, as illustrated in FIGS. 5 and 6, another example of the semiconductor package of the present invention includes a semiconductor package 9 having a structure in which the semiconductor chips 4 are bonded with the thermally curable component of the adhesive layer of the dicing die attach film of the present invention, in addition to bonding of the semiconductor chip 4 and the wiring board 6.

Further, use of the adhesive layer in the dicing die attach film of the present invention for bonding between the semiconductor chips when the semiconductor chips are multistacked provides a semiconductor package having a structure in which the semiconductor chips are bonded with the thermally curable component of the adhesive layer of the dicing die attach film of the present invention. In this case, the semiconductor chip and the wiring board may be bonded with the thermally curable component of the adhesive layer of the dicing die attach film of the present invention (for example, FIGS. 5 and 6), or may be bonded with an adhesive layer which is typically used as a thermally conductive adhesive layer. However, it is preferable that the semiconductor chip and the wiring board is bonded with the thermally curable component of the adhesive layer 2 of the dicing die attach film of the present invention.

Note that, in the semiconductor package 9 having a structure described in FIGS. 4 to 7, the adhesive layer 2 between the semiconductor chip 4 and the wiring board 6, and between the semiconductor chips 4 is present in a state of being thermally cured, that is, a state in which the adhesive layer 2 bonds respective members as a thermally curable component of the adhesive layer.

EXAMPLES

Hereinafter, the present invention will be described in more detail based on examples and comparative examples, but the present invention is not meant to be limited by the following examples. Also, the room temperature means 25° C., MEK is methyl ethyl ketone, and PET is polyethylene terephthalate.

Example 1

[1. Production of Temporary-Adhesive Layer (Dicing Film)]
(1) Production of Substrate Film Resin pellets of low density polyethylene (LDPE, density: 0.92 g/cm$^3$, melting point: 110° C.) were melted at 230° C. and then extruded into a long film with a thickness of 70 μm by using an extruder. The obtained film was irradiated with 100 kGy of electron beams, thus producing a substrate film.
(2) Production of Temporary-Adhesive Layer A copolymer containing 50 mol % of butylacrylate, 45 mol % of 2-hydroxyethyl acrylate, and 5 mol % of methacrylic acid and having a mass average molecular weight of 800,000 was prepared. 2-isocyanatoethyl methacrylate was added to the copolymer so that the iodine value was 20, thus preparing an acrylic copolymer having a glass transition temperature of −40° C., a hydroxyl value of 30 mgKOH/g, and an acid value of 5 mgKOH/g.

Thereafter, 5 parts by mass of Coronate L (trade name, manufactured by Nippon Polyurethane Industry Co., Ltd.) as polyisocyanate and 3 parts by mass of Esacure KIP 150 (trade name, manufactured by Lamberti) as a photopolymerization initiator were added to 100 parts by mass of the prepared acrylic copolymer to prepare a mixture. The mixture was dissolved in ethyl acetate and the solution was stirred to prepare a temporary-adhesive composition.

Then, this temporary-adhesive composition was applied onto a release liner made of a release-treated polyethylene terephthalate (PET) film to have a dry thickness of 20 μm, and then dried at 110° C. for 3 minutes, thus forming a temporary-adhesive layer. The prepared substrate film and the temporary-adhesive layer were bonded to produce a dicing film in which the temporary-adhesive layer is formed on the substrate film.

[2. Production of Adhesive Layer (Die Attach Film)]

In a 1,000 ml separable flask, 56 parts by mass of triphenylmethane type epoxy resin (trade name: EPPN-501H, mass average molecular weight: 1,000, softening point: 55° C., semi-solid, epoxy equivalent amount: 167 g/eq, manufactured by Nippon Kayaku Co., Ltd.), 49 parts by mass of bisphenol A type epoxy resin (trade name: YD-128, mass average molecular weight: 400, softening point: less than 25° C., liquid, epoxy equivalent amount: 190 g/eq, manufactured by NSCC Epoxy Manufacturing Co., Ltd.), 30 parts by mass of bisphenol A type phenoxy resin (trade name: YP-50, mass average molecular weight: 70,000, Tg: 84° C., normal temperature (25° C.), elastic modulus: 1,700 MPa, manufactured by NSCC Epoxy Manufacturing Co., Ltd.), and 67 parts by mass of MEK were heated with stirring at 110° C. for 2 hours, thus obtaining a resin varnish.

Subsequently, this resin varnish was transferred to an 800 ml planetary mixer, and 205 parts by mass of alumina filler (trade name: AO-502, manufactured by Admatechs, average particle diameter (d50): 0.6 μm) was introduced to the mixer. Further, 8.5 parts by mass of imidazole type curing agent (trade name: 2PHZ-PW, manufactured by Shikoku Chemicals Corporation) and 3.0 parts by mass of silane coupling agent (trade name: Sila-Ace S-510, manufactured by JNC Corporation) were introduced to the mixer, and the contents were then mixed with stirring for 1 hour at room temperature. Then defoaming under vacuum was conducted, thus obtaining a mixed varnish.

Thereafter, the resulting mixed varnish was applied onto a release-treated PET film (release film) having a thickness of 38 μm and dried by heating at 130° C. for 10 minutes. Thus, a die attach film in which an adhesive layer having a length of 300 mm, a width of 200 mm, and a thickness of 10 μm is formed on the release film was produced. The thickness is a value measured by the above-described method.

[3. Production of Dicing Die Attach Film]

Then, the dicing film was cut into a circular shape so that the dicing film can be bonded to cover the opening of the ring frame. Further, the die attach film was cut into a circular shape to cover the back surface of the wafer.

The temporary-adhesive layer exposed by peeling the release liner from the dicing film cut as described above and the adhesive layer of the die attach film cut as described above were bonded by using a roll press machine under the condition of a load of 0.4 MPa and a rate of 1.0 m/min, thus producing a dicing die attach film. In this dicing die attach film, the dicing film is larger than the die attach film and has a portion in which the temporary-adhesive layer is exposed around the adhesive layer.

Example 2

A dicing die attach film was produced in the same manner as in Example 1 except for using 320 parts by mass of alumina filler (trade name: AO-502, manufactured by Admatechs, average particle diameter (d50): 0.6 μm).

Example 3

A dicing die attach film was produced in the same manner as in Example 1 except for using 480 parts by mass of alumina filler (trade name: AO-502, manufactured by Admatechs, average particle diameter (d50): 0.6 μm).

Example 4

A dicing die attach film was produced in the same manner as in Example 1 except for using 30 parts by mass of bisphenol A/F copolymer type phenoxy resin (trade name: YP-70, mass average molecular weight: 55,000, Tg: 72° C., normal temperature (25° C.) elastic modulus: 1,400 MPa, manufactured by NSCC Epoxy Manufacturing Co., Ltd.) in place of the bisphenol A type phenoxy resin.

Example 5

A dicing die attach film was produced in the same manner as in Example 1 except for using 30 parts by mass of low-elastic high-heat resistant phenoxy resin (trade name: FX-310, mass average molecular weight: 40,000, Tg: 110° C., normal temperature (25° C.) elastic modulus: 500 MPa, manufactured by NSCC Epoxy Manufacturing Co., Ltd.) in place of the bisphenol A type phenoxy resin.

Example 6

A dicing die attach film was produced in the same manner as in Example 1 except for using 44 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 350 parts by mass of alumina filler (trade name: AO-502, manufactured by Admatechs, average particle diameter (d50): 0.6 μm).

Example 7

A dicing die attach film was produced in the same manner as in Example 1 except for using 70 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 400 parts by mass of alumina filler (trade name: AO-502, manufactured by Admatechs, average particle diameter (d50): 0.6 μm).

Example 8

A dicing die attach film was produced in the same manner as in Example 1 except for using 50 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 360 parts by mass of silver filler (trade name: AG-4-8F, manufactured by DOWA Electronics Materials Co., Ltd, average particle diameter (d50): 2.0 μm).

Example 9

A dicing die attach film was produced in the same manner as in Example 1 except for using 50 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 610 parts by mass of silver filler (trade name: AG-4-8F, manufactured by DOWA Electronics Materials Co., Ltd, average particle diameter (d50): 2.0 µm).

Example 10

A dicing die attach film was produced in the same manner as in Example 1 except for using 50 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 950 parts by mass of silver filler (trade name: AG-4-8F, manufactured by DOWA Electronics Materials Co., Ltd, average particle diameter (d50): 2.0 µm).

Comparative Example 1

A dicing die attach film was produced in the same manner as in Example 1 except for using 10 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 280 parts by mass of alumina filler (trade name: AO-502, manufactured by Admatechs, average particle diameter (d50): 0.6 µm).

Comparative Example 2

A dicing die attach film was produced in the same manner as in Example 1 except for using 250 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 800 parts by mass of alumina filler (trade name: AO-502, manufactured by Admatechs, average particle diameter (d50): 0.6 µm).

Comparative Example 3

A dicing die attach film was produced in the same manner as in Example 1 except for using 250 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.) and 130 parts by mass of alumina filler (trade name: AO-502, manufactured by Admatechs, average particle diameter (d50): 0.6 µm).

Comparative Example 4

A dicing die attach film was produced in the same manner as in Example 1 except for using 30 parts by mass of bisphenol F+ 1,6-hexanediol diglycidyl ether type phenoxy resin (trade name: YX-7180, mass average molecular weight: 50,000, Tg: 15° C., normal temperature (25° C.) elastic modulus: 200 MPa, manufactured by Mitsubishi Chemical Corporation) and 320 parts by mass of alumina filler (trade name: AO-502, manufactured by Admatechs, average particle diameter (d50): 0.6 µm).

Comparative Example 5

A dicing die attach film was produced in the same manner as in Example 1 except for using 120 parts by mass of acrylic polymer solution (trade name: S-2060, mass average molecular weight: 500,000, Tg: −23° C., normal temperature (25° C.) elastic modulus: 50 MPa, solid content: 25% (organic solvent: toluene), manufactured by TOAGOSEI Co., Ltd.) (among which, the blended amount of acrylic polymer itself is 30 parts by mass) and 320 parts by mass of alumina filler (trade name: AO-502, manufactured by Admatechs, average particle diameter (d50): 0.6 µm).

The elastic modulus before curing, melt viscosity, peeling strength, die attach property evaluation, thermal conductivity, and continuous pickup property were performed for each dicing die attach film produced described above by the methods described below.

The obtained results are summarized and shown in Table 1 together with the composition of the adhesive layer.

<Measurement of Elastic Modulus Before Curing and Melt Viscosity>

Squares having a size of 5.0 cm in length×5.0 cm in width were each cut out from the produced dicing die attach film, and the dicing film (temporary-adhesive layer and substrate film) and the release film were peeled. The cut samples were laminated and bonded on a hot plate at a stage temperature of 70° C. by a hand roller. Thus, a test piece of the adhesive layer having a thickness of approximately 1.0 mm was obtained.

A change in viscosity resistance in a temperature range of 20 to 250° C. at a temperature elevation rate of 5° C./min was measured for this test piece by using a rheometer (RS6000, manufactured by Haake). The elastic moduli before curing G' at 25° C. and 80° C. (kPa) and the melt viscosity at 120° C. (Pas) were respectively calculated from the obtained temperature-viscosity resistance curve.

<Peeling Strength>

The dicing die attach film produced above was irradiated with ultraviolet rays from the dicing film (temporary-adhesive layer) side by using an ultraviolet ray irradiator (trade name: RAD-2000F/8, manufactured by Lintec Corporation, irradiation amount: 200 mJ/cm$^2$). Then, the interlayer peeling strengths between the adhesive layer and the dicing film (temporary-adhesive layer and substrate film) were respectively measured at room temperature and in a thermostatic chamber set at 80° C.

Measurement condition: in accordance with JIS Z0237, 180° peel test

Measurement apparatus: tensile tester (manufactured by Shimadzu Corporation, model No.: TCR1L type)

<Evaluation of Die Attach Property>

The release film was first peeled off from the dicing die attach film produced above. The dicing die attach film was then bonded to one surface of a dummy silicon wafer (size: 8 inch, thickness: 100 µm) by using a manual laminator (trade name: FM-114, manufactured by Technovision, Inc.) at a temperature of 70° C. and a pressure of 0.3 MPa. Then, dicing was performed from the dummy silicon wafer side to form squares each having a size of 10 mm×10 mm by using a dicing apparatus (trade name: DFD-6340, manufactured by DISCO Corporation) equipped with two axes of dicing blades (Z1: NBC-ZH2050 (27HEDD), manufactured by DISCO Corporation/Z2: NBC-ZH127F-SE(BC), manufactured by DISCO Corporation), thus obtaining a dummy chip with an adhesive layer.

Thereafter, the prepared dummy chip with an adhesive layer was irradiated with ultraviolet rays from the back surface side of the wafer by using an ultraviolet ray irradiator (trade name: RAD-2000F/8, manufactured by Lintec Corporation, irradiation amount: 200 mJ/cm$^2$). Then, the dummy chip with an adhesive layer was thermocompression bonded to the mounting surface side of a lead frame substrate (42Arroy-based, manufactured by Toppan Printing Co., Ltd.) by a die bonder (trade name: DB-800, manufactured by Hitachi High-Tech Corporation) under the condition of a temperature of 120° C., a pressure of 0.1 MPa (load: 400 gf) for 1.0 seconds.

The presence of generation of voids at the interface between the adhesive layer and the mounting surface of the lead frame substrate was observed for the dummy chip with an adhesive layer which has been thermocompression bonded on the substrate, by using an ultrasonic flaw detector (SAT) (FS300III, manufactured by Hitachi Power Solutions Co., Ltd.). Evaluation of the die attach property was performed based on the following criteria. In the present invention, rank "B" or higher is evaluated as being passed.
—Evaluation Criteria—
A: No void is observed in all the mounted 24 dummy chips.
B: There are 1 to 5 dummy chips having voids generated out of 24 mounted dummy chips.
C: There are 6 or more dummy chips having voids generated out of 24 mounted dummy chips.

<Thermal Conductivity after Thermal Curing>

Square pieces with a side of 50 mm or more were each cut out from the dicing die attach film produced above, and the dicing film (temporary-adhesive layer and substrate film) and the release film were peeled. Then, the cut samples were laminated to obtain an adhesive layer laminate having a thickness of 5 mm or more.

This sample was placed on a disk-shaped mold with a diameter of 50 mm and a thickness 5 mm, heated at a temperature of 150° C., a pressure of 2 MPa for 10 minutes by using a compression molding machine, and then taken out. The sample was further heated in a dryer at a temperature of 180° C. for 1 hour to thermally cure the adhesive layer. Thus, a disk-shaped test piece having a diameter of 50 mm and a thickness of 5 mm was obtained.

The thermal conductivity (W/(m·K)) was measured for this test piece by using a thermal conductivity measurement apparatus (trade name: HC-110, manufacture by Eko Instruments Co., Ltd) according to the heat flow meter method (in accordance with JIS-A1412).

<Evaluation of Continuous Pickup Property>

The release film was first peeled off from the dicing die attach film produced above. The dicing die attach film was then bonded to one surface of a dummy silicon wafer (size: 8 inch, thickness: 100 μm) by using a manual laminator (trade name: FM-114, manufactured by Technovision, Inc.) at a temperature of 70° C. and a pressure of 0.3 MPa. Then, dicing was performed from the dummy silicon wafer side to form squares each having a size of 5 mm×5 mm by using a dicing apparatus (trade name: DFD-6340, manufactured by DISCO Corporation) equipped with two axes of dicing blades (Z1: NBC-ZH2050 (27HEDD), manufactured by DISCO Corporation/Z2: NBC-ZH127F-SE(BC), manufactured by DISCO Corporation), thus obtaining a dummy chip with an adhesive layer.

Next, the prepared dummy chip was irradiated with ultraviolet rays from the back surface side of the wafer by using an ultraviolet ray irradiator (trade name: RAD-2000F/8, manufactured by Lintec Corporation, irradiation amount: 200 mJ/cm$^2$). Then, the dummy chip with an adhesive layer was picked up from the dicing film (temporary-adhesive layer and substrate film) and thermocompression bonded to the mounting surface side of a lead frame substrate (42Arroy-based, manufactured by Toppan Printing Co., Ltd.) by a die bonder (trade name: DB-800, manufactured by Hitachi High-Tech Corporation) under the condition of a temperature of 120° C., a pressure of 0.1 MPa (load: 400 gf) for 1.0 seconds. This step of picking up and thermocompression bonding was continuously repeated, and evaluation of the continuous pickup property was performed based on the following criteria. In the present invention, rank "B" or higher is evaluated as being passed.
—Evaluation Criteria—
A: No failure such as a pickup miss, and an adhesive layer remaining on the dicing film is observed in all of 96 dummy chips which have been continuously picked up and thermocompression bonded.
B: There are 1 to 10 dummy chips in which failures such as a pickup miss, and an adhesive layer remaining on the dicing film occur out of 96 dummy chips which have been continuously picked up and thermocompression bonded.
C: There are 11 or more dummy chips in which failures such as a pickup miss, and an adhesive layer remaining on the dicing film occur out of 96 dummy chips which have been continuously picked up and thermocompression bonded.

<Measurement of Average Particle Diameter (d50)>

A measurement sample was prepared by weighing 0.1 g of each of inorganic fillers used above and 9.9 g of MEK respectively, and subjecting a mixture thereof to ultrasonic dispersion treatment for 5 minutes. The average particle diameter (d50) of this measurement sample was determined from the cumulative curve of the volume fraction of the particle diameter in the particle size distribution measured by the laser diffraction scattering method (model: LMS-2000e, manufactured by Seishin Enterprise Co., Ltd.).

<Elastic Modulus at Normal Temperature (25° C.) of Phenoxy Resin>

In a 500 ml separable flask, 30 parts by mass of each of various types of phenoxy resins and 70 parts by mass of MEK (methyl ethyl ketone) were heated with stirring at a temperature of 110° C. for 2 hours to obtain a resin varnish.

Thereafter, this resin varnish was applied onto a release-treated PET film (release film) having a thickness of 38 μm and then dried by heating at 130° C. for 10 minutes to obtain a phenoxy resin film having a length of 300 mm, a width of 200 mm, and a thickness of 100 μm.

This phenoxy resin film was cut into a size of 5 mm×17 mm. The cut film was measured by using a dynamic viscoelasticity measurement apparatus (trade name: Rheogel-E4000F, manufactured by UBM) under the condition of a measurement temperature range of 0 to 100° C., a temperature elevation rate of 5° C./min, and a frequency of 1 Hz. The value of the elastic modulus at 25° C. was thus obtained.

Incidentally, as for the acrylic resin used in Comparative Example 5, the elastic modulus at 25° C. was determined based on the above method similarly to the phenoxy resin.

<Glass Transition Temperature (Tg) of Phenoxy Resin>

Measurement was performed for the phenoxy resin film produced by the method described in the measurement of the elastic modulus, by using a differential scanning calorimeter (model: DSC7000, manufactured by Hitachi High-Tech Science Corporation) under the condition of a temperature elevation rate of 5° C./min. A temperature at which the base line is shifted to the endothermic peak side was determined to be the glass transition temperature (Tg).

<Mass Average Molecular Weight>

The mass average molecular weight for each of various types of phenoxy resins was measured by using gel permeation chromatography (model: HLC-8320, manufactured by Tosoh Corporation) using tetrahydrofuran as an eluent under the condition of a flow rate of 1 ml/min and a column chamber temperature of 40° C. The mass average molecular weight was calculated using a standard polystyrene calibration curve.

Note that, as for the acrylic resin used in Comparative Example 5, the elastic modulus at 25° C., the glass transition temperature, and the mass average molecular weight were determined based on the above methods similarly to the phenoxy resin.

TABLE 1-1

| | | | Example | | | | |
|---|---|---|---|---|---|---|---|
| | | | 1 | 2 | 3 | 4 | 5 |
| Adhesive layer [Parts by mass] | Epoxy resin (A) | EPPN-501H (triphenylmethane type epoxy resin) | 56 | 56 | 56 | 56 | 56 |
| | | YD-128 (liquid bis-A type epoxy resin) | 49 | 49 | 49 | 49 | 49 |
| | Polymer resin | YP-50 (bis-A type phenoxy resin) | 30 | 30 | 30 | — | — |
| | | YP-70 (bis-A/bis-F copolymer type phenoxy resin) | — | — | — | 30 | — |
| | | FX-310 (low-elastic high-heat resistant phenoxy resin) | — | — | — | — | 30 |
| | Inorganic filler (D) | AO502 (alumina) | 205 | 320 | 480 | 320 | 32 |
| | | AG-4-8F (silver) | — | — | — | — | — |
| | Surface treatment agent | S-510 (epoxysilane type silane coupling agent) | 3.0 | 3.0 | 3.0 | 3.0 | 3.0 |
| | Epoxy resin curing agent (B) | 2PHZ-PW (imidazole-based curing agent) | 8.5 | 8.5 | 8.5 | 8.5 | 8.5 |
| | | Blended amount in terms of total solid content [parts by mass] | 351 | 466 | 626 | 466 | 466 |
| | | Inorganic filler amount [vol %] | 30% | 40% | 50% | 40% | 40% |
| | | Polymer resin amount/(epoxy resin + polymer resin)[wt %] | 22% | 22% | 22% | 22% | 22% |
| Characterics/ evaluation | | Elastic modulus G' before curing at 25° C. [kPa] | 691 | 862 | 910 | 481 | 910 |
| | | Elastic modulus G' before curing at 80° C. [kPa] | 25 | 46 | 65 | 19 | 52 |
| | | Peeling strength at 25° C. [N/25 mm] | 0.15 | 0.14 | 0.12 | 0.16 | 0.15 |
| | | Peeling strength at 80° C. [N/25 mm] | 0.30 | 0.28 | 0.26 | 0.38 | 0.30 |
| | | Melt viscosity at 120° C. [Pa · s] | 6900 | 8600 | 9000 | 4800 | 9150 |
| | | Die attach property evaluation | A | A | A | A | A |
| | | Thermal conductivity [W/m · K] | 1.0 | 1.5 | 1.8 | 1.5 | 1.5 |
| | | Continuous pickup evaluation | A | A | A | B | A |

| | | | Example | | | | |
|---|---|---|---|---|---|---|---|
| | | | 6 | 7 | 8 | 9 | 10 |
| Adhesive layer [Parts by mass] | Epoxy resin (A) | EPPN-501H (triphenylmethane type epoxy resin) | 56 | 56 | 56 | 56 | 56 |
| | | YD-128 (liquid bis-A type epoxy resin) | 49 | 49 | 49 | 49 | 49 |
| | Polymer resin | YP-50 (bis-A type phenoxy resin) | 44 | 70 | 50 | 50 | 50 |
| | | YP-70 (bis-A/bis-F copolymer type phenoxy resin) | — | — | — | — | — |
| | | FX-310 (low-elastic high-heat resistant phenoxy resin) | — | — | — | — | — |
| | Inorganic filler (D) | AO502 (alumina) | 350 | 400 | — | — | — |
| | | AG-4-8F (silver) | — | — | 360 | 610 | 950 |
| | Surface treatment agent | S-510 (epoxysilane type silane coupling agent) | 3.0 | 3.0 | 3.0 | 3.0 | 3.0 |
| | Epoxy resin curing agent (B) | 2PHZ-PW (imidazole-based curing agent) | 8.5 | 8.5 | 8.5 | 8.5 | 8.5 |
| | | Blended amount in terms of total solid content [parts by mass] | 510 | 586 | 526 | 776 | 1116 |
| | | Inorganic filler amount [vol %] | 40% | 40% | 20% | 30% | 40% |
| | | Polymer resin amount/(epoxy resin + polymer resin)[wt %] | 30% | 40% | 32% | 32% | 32% |
| Characterics/ evaluation | | Elastic modulus G' before curing at 25° C. [kPa] | 1002 | 1230 | 610 | 920 | 1210 |
| | | Elastic modulus G' before curing at 80° C. [kPa] | 70 | 90 | 12 | 25 | 44 |
| | | Peeling strength at 25° C. [N/25 mm] | 0.12 | 0.10 | 0.14 | 0.12 | 0.10 |
| | | Peeling strength at 80° C. [N/25 mm] | 0.25 | 0.23 | 0.27 | 0.24 | 0.22 |
| | | Melt viscosity at 120° C. [Pa · s] | 9500 | 10000 | 2040 | 7880 | 9760 |
| | | Die attach property evaluation | B | B | A | A | A |
| | | Thermal conductivity [W/m · K] | 1.4 | 1.4 | 6.2 | 18.2 | 26.2 |
| | | Continuous pickup evaluation | A | A | A | A | A |

TABLE 1-2

|  |  |  | Comparative Example | | | | |
|---|---|---|---|---|---|---|---|
|  |  |  | 1 | 2 | 3 | 4 | 5 |
| Adhesive layer [Parts by mass] | Epoxy resin (A) | EPPN-501H (triphenylmethane type epoxy resin) | 56 | 56 | 56 | 56 | 56 |
|  |  | YD-128 (liquid bis-A type epoxy resin) | 49 | 49 | 49 | 49 | 49 |
|  | Polymer resin | YP-50 (bis-A type phenoxy resin) | 10 | 250 | 250 | — | — |
|  |  | YX-7180 (flexible phenoxy resin) | — | — | — | 30 | — |
|  |  | S-2060 (acrylic resin) | — | — | — | — | 30 |
|  | Inorganic filler (D) | AO502 (alumina) | 280 | 800 | 130 | 320 | 320 |
|  |  | AG-4-8F (silver) | — | — | — | — | — |
|  | Surface treatment agent | S-510 (epoxysilane type silane coupling agent) | 3.0 | 3.0 | 3.0 | 3.0 | 3.0 |
|  | Epoxy resin curing agent (B) | 2PHZ-PW (imidazole-based curing agent) | 8.5 | 8.5 | 8.5 | 8.5 | 8.5 |
|  |  | Blended amount in terms of total solid content [parts by mass] | 406 | 1167 | 497 | 466 | 466 |
|  |  | Inorganic filler amount [vol %] | 40% | 40% | 10% | 40% | 40% |
|  |  | Polymer resin amount/(epoxy resin + polymer resin)[wt %] | 9% | 70% | 70% | 22% | 22% |
| Characteristics/ evaluation |  | Elastic modulus G' before curing at 25° C. [kPa] | 560 | 1200 | 1000 | 130 | 50 |
|  |  | Elastic modulus G' before curing at 80° C. [kPa] | 9 | 230 | 130 | 4 | 6 |
|  |  | Peeling strength at 25° C. [N/25 mm] | 0.25 | 0.05 | 0.16 | 0.35 | 0.53 |
|  |  | Peeling strength at 80° C. [N/25 mm] | 0.50 | 0.12 | 0.20 | 0.75 | 0.83 |
|  |  | Melt viscosity at 120° C. [Pa · s] | 1200 | 30000 | 12000 | 5000 | 9000 |
|  |  | Die attach property evaluation | A | C | C | A | A |
|  |  | Thermal conductivity [W/m · K] | 1.5 | 1.6 | 0.4 | 1.5 | 1.4 |
|  |  | Continuous pickup evaluation | C | A | A | C | C |

<Notes of Tables>

The symbol "-" in the row of the adhesive layer means not containing the corresponding component.

The following is clear from Table 1.

In the dicing die attach film of Comparative Example 1, the proportion of the phenoxy resin (C) in total content of the epoxy resin (A) and the phenoxy resin (C) is less than 10% by mass, and the peeling strength between the adhesive layer and the temporary-adhesive layer at 80° C. is more than 0.40 N/25 mm. In this dicing die attach film of Comparative Example 1, when the chips were continuously picked up, pickup failures occurred in 11 or more chips out of 96 chips due to heat storage of the pickup collet, resulting in poor pickup property.

In the dicing die attach films of Comparative Examples 2 and 3, the proportion of the phenoxy resin (C) in total content of the epoxy resin (A) and the phenoxy resin (C) is more than 60% by mass. In the dicing die attach films of Comparative Examples 2 and 3, voids were generated in 6 or more chips out of 24 chips at the time of thermocompression bonding to the wiring board, and suppression of generation of voids was insufficient. Meanwhile, in the dicing die attach film of Comparative Example 3, the thermal conductivity of the adhesive layer after thermal curing was less than 1.0 W/m·K, which was low, and a heat dissipation performance as an adhesive applied to the semiconductor package was insufficient.

In the dicing die attach film of Comparative Example 4, the elastic modulus of the phenoxy resin (C) at 25° C. was less than 500 MPa. Meanwhile, the dicing die attach film of Comparative Example 5 does not contain the phenoxy resin, but contains an acrylic resin (elastic modulus at 25° C. was less than 500 MPa). In these dicing die attach films of Comparative Examples 4 and 5, when the chips were continuously picked up, pickup failures occurred in 11 or more chips out of 96 chips due to heat storage of the pickup collet, resulting in poor pickup property.

In contrast, the dicing die attach films of Examples 1 to 10 of the present invention were excellent in a continuous pickup property in the semiconductor processing and less likely to cause a pickup failure even when the pickup collet stored heat. Further, the dicing die attach films of Examples 1 to 10 were excellent in suppressing generation of voids at the time of thermocompression bonding to the wiring board.

REFERENCE SIGNS LIST

1 Semiconductor wafer
2 Adhesive layer
3 Temporary-adhesive layer
4 Semiconductor chip
5 Semiconductor chip with a film-like adhesive
6 Wiring board
7 Bonding wire
8 Sealing resin
9 Semiconductor package

The invention claimed is:
1. A dicing die attach film, comprising:
an adhesive layer; and
a temporary-adhesive layer,
wherein the adhesive layer and the temporary-adhesive layer are laminated,
wherein the adhesive layer is a film-like adhesive layer containing an epoxy resin (A), an epoxy resin curing agent (B), a phenoxy resin (C), and an inorganic filler (D);
wherein an elastic modulus of the phenoxy resin (C) at 25° C. is 500 MPa or more;
wherein, in the adhesive layer, a proportion of the phenoxy resin (C) in total content of the epoxy resin (A) and the phenoxy resin (C) is 10 to 60% by mass;
wherein a peeling strength between the adhesive layer and the temporary-adhesive layer at a range of 25 to 80° C. is 0.40 N/25 mm or less; and wherein a thermal conductivity of the adhesive layer after thermal curing is 1.0 W/m·K or more.

2. The dicing die attach film according to claim 1, wherein when the adhesive layer is heated at a temperature elevation rate of 5° C./min from 25° C., an elastic modulus G' before curing in a range of 25 to 80° C. is 10 kPa or more.

3. The dicing die attach film according to claim 1, wherein when the adhesive layer is heated at a temperature elevation rate of 5° C./min from 25° C., a melt viscosity at 120° C. is in a range of 500 to 10,000 Pa·s.

4. The dicing die attach film according to claim 1, wherein the temporary-adhesive layer is energy ray-curable.

* * * * *